United States Patent
Kamiguchi

(10) Patent No.: US 8,379,389 B2
(45) Date of Patent: Feb. 19, 2013

(54) DISPLAY PANEL AND IMAGE DISPLAY APPARATUS

(75) Inventor: Kinya Kamiguchi, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 294 days.

(21) Appl. No.: 12/949,572

(22) Filed: Nov. 18, 2010

(65) Prior Publication Data

US 2011/0141694 A1 Jun. 16, 2011

(30) Foreign Application Priority Data

Dec. 14, 2009 (JP) .................................. 2009-283453

(51) Int. Cl.
*H05K 7/20* (2006.01)
*H01J 7/24* (2006.01)
*F21V 29/00* (2006.01)

(52) U.S. Cl. .................. 361/708; 361/704; 361/679.54; 313/46; 257/713; 362/373; 362/218; 362/264; 362/294

(58) Field of Classification Search .................. 361/704, 361/708, 679.54; 313/33, 46, 582; 257/712–713; 362/373, 218, 264, 294

See application file for complete search history.

(56) References Cited

U.S. PATENT DOCUMENTS

| | | | | | |
|---|---|---|---|---|---|
| 5,990,618 | A * | 11/1999 | Morita et al. | | 313/582 |
| 7,457,121 | B2 * | 11/2008 | Kim et al. | | 361/704 |
| 7,518,298 | B2 * | 4/2009 | Kim et al. | | 313/46 |
| 7,535,174 | B2 * | 5/2009 | Shin | | 313/582 |
| 8,059,408 | B2 * | 11/2011 | Lemak et al. | | 361/708 |
| 2007/0228918 | A1 * | 10/2007 | Kang | | 313/269 |
| 2008/0174231 | A1 * | 7/2008 | Takahashi et al. | | 313/496 |
| 2008/0174232 | A1 * | 7/2008 | Ibuki et al. | | 313/496 |

FOREIGN PATENT DOCUMENTS

| | | |
|---|---|---|
| JP | 2002-156913 A | 5/2002 |
| JP | 2004-333904 A | 11/2004 |
| JP | 2008-292824 A | 12/2008 |

* cited by examiner

*Primary Examiner* — Zachary M Pape
(74) *Attorney, Agent, or Firm* — Canon U.S.A, Inc. IP Division

(57) ABSTRACT

A display panel includes an airtight casing and a thermally conductive member. A thermal conductivity of the thermally conductive member in a longitudinal direction of spacers is higher than a thermal conductivity of the thermally conductive member in a direction in which the spacers are provided side by side, and the thermal conductivity of the thermally conductive member in the direction in which the spacers are provided side by side is higher than a thermal conductivity of the thermally conductive member in a thickness direction.

15 Claims, 7 Drawing Sheets

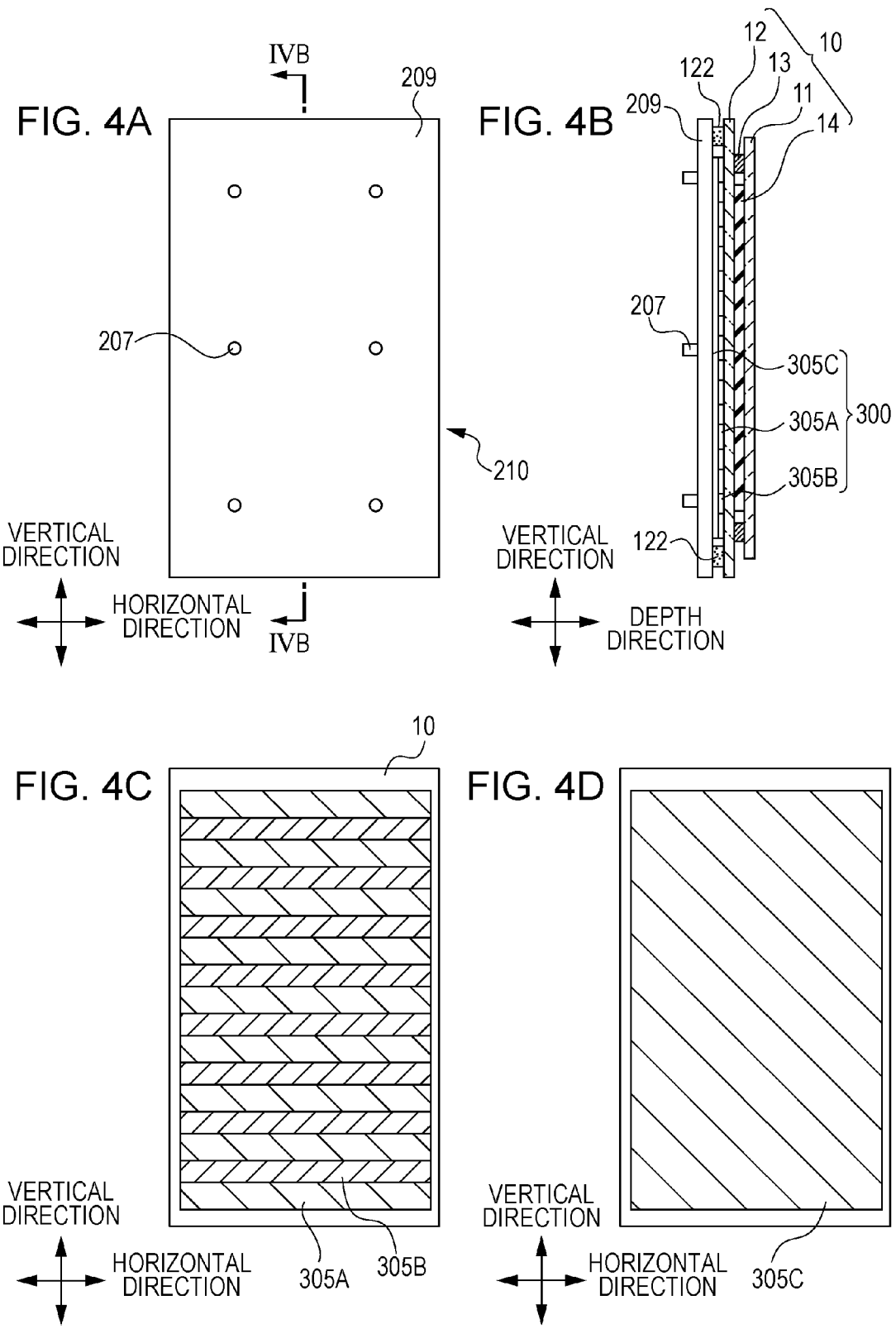

DISPLAY PANEL AND IMAGE DISPLAY APPARATUS

BACKGROUND OF THE INVENTION

1. Field of the Invention

The present invention relates to a display panel called a flat panel display (FPD) and an image display apparatus including the display panel.

2. Description of the Related Art

In recent years, development of image display apparatuses including display panels such as a liquid crystal display (LCD), a plasma display (PDP), a field emission display (FED), and an organic electroluminescent display (OLED) has become more active.

As the thickness and weight of such an image display apparatus have been reduced, the distance between the display panel and an electric circuit board has become shorter, producing a tendency toward high heat-generation density. In addition, an increase in brightness of the display panel, for example, has produced another tendency toward an increased amount of heat generation. Consequently, temperature variation may occur in the display panel, producing thermal stress that may damage the display panel. To avoid this, exemplary apparatuses including configurations for releasing heat generated in the display panel are disclosed in Japanese Patents Laid-Open No. 2002-156913, No. 2004-333904, and No. 2008-292824.

In the apparatus disclosed in Japanese Patent Laid-Open No. 2002-156913, a thermally conductive sheet, which is a silicon or carbon sheet, is provided between the rear of a PDP and a chassis. In the apparatus disclosed in Japanese Patent Laid-Open No. 2004-333904, a PDP is secured at the rear thereof to a holding plate, which is made of aluminum or the like and has a heat dissipating function, with a plurality of linear thermally conductive members interposed therebetween, the thermally conductive members extending parallel to the gravitational direction. In the apparatus disclosed in Japanese Patent Laid-Open No. 2008-292824, a chassis made of aluminum or the like and provided on the rear of a PDP is divided into a plurality of pieces, a lower one of the pieces having a convex shape covering a central portion of the PDP, an upper one of the pieces having a concave shape avoiding the central portion of the PDP.

SUMMARY OF THE INVENTION

According to an aspect of the present invention, a display panel includes an airtight casing including a front substrate, a rear substrate facing the front substrate with a gap therebetween, and a plurality of plate-like spacers provided side by side between the front substrate and the rear substrate in such a manner as to be parallel to each other in a longitudinal direction thereof; and a thermally conductive member connected to a surface of the rear substrate remote from the front substrate. A thermal conductivity of the thermally conductive member in the longitudinal direction of the spacers is higher than a thermal conductivity of the thermally conductive member in a direction in which the spacers are provided side by side, and the thermal conductivity of the thermally conductive member in the direction in which the spacers are provided side by side is higher than a thermal conductivity of the thermally conductive member in a thickness direction.

According to another aspect of the present invention, a display panel includes an airtight casing including a front substrate and a rear substrate facing the front substrate with a gap therebetween; a thermally conductive member connected to a surface of the rear substrate remote from the front substrate; and a securing member connected to the rear substrate. The securing member is connected to a support capable of supporting the display panel, the securing member being connected such that a surface of the front substrate near the rear substrate extends in a gravitational direction defined in a state where the display panel is oriented so as to display an image. A thermal conductivity of the thermally conductive member in the gravitational direction is lower than a thermal conductivity of the thermally conductive member in a horizontal direction orthogonal to the gravitational direction, and the thermal conductivity of the thermally conductive member in the gravitational direction is higher than a thermal conductivity of the thermally conductive member in a thickness direction.

Further features of the present invention will become apparent from the following description of exemplary embodiments with reference to the attached drawings.

BRIEF DESCRIPTION OF THE DRAWINGS

FIGS. 4A to 4D schematically show another exemplary configuration of the display panel.

DESCRIPTION OF THE EMBODIMENTS

Figure 1A:
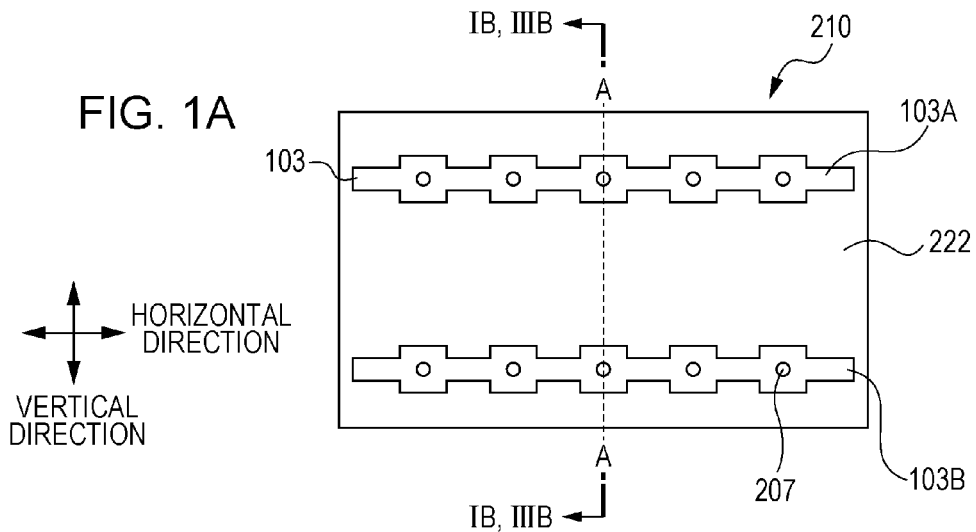
FIGS. 1A to 1C schematically show an exemplary configuration of a display panel.

In each of the apparatuses disclosed in Japanese Patents Laid-Open No. 2002-156913, No. 2004-333904, and No. 2008-292824, the temperature variation occurring on the rear of the display panel is reduced. On the front of the display panel, however, it is unavoidable that there occurs such temperature variation that, in the vertical direction, the temperature is higher in an upper portion than in a lower portion because of a cooling effect produced by natural convection. Therefore, the difference in temperature between the front and rear of the display panel is small in the central portion of the display panel but is large in the upper and lower portions, in the vertical direction, of the display panel.

Accordingly, local temperature variation may occur in members (typically, glass substrates) forming the display panel, leading to damage to the display panel (damage to the glass substrates).

In a display panel such as an FED, described in detail separately below, in which electrons emitted from electron-emitting members are applied to light-emitting members such as phosphors, the pressure inside an airtight casing is maintained to be lower than the atmospheric pressure, i.e., vacuum. Therefore, a plurality of spacers are provided in the airtight casing. The spacers are desired to have a very high resistance. Materials having high resistances usually have negative temperature coefficients of resistance (TCR). Hence, if there is any difference between the temperature variations occurring on the front and on the rear of the FED as described above, resistance variation may also occur between the spacers or in a single spacer. A change in the resistance of a spacer may affect the trajectory of electrons emitted from electron-emitting devices provided near the spacer. Consequently, the quality of an image to be displayed may be deteriorated.

An embodiment of the display panel and image display apparatus according to the present invention will now be described with reference to the accompanying drawings. Elements common to the drawings are denoted by common reference numerals. While a display panel 210 exemplified herein is an FED, the display panel 210 may alternatively be a PDP, an LCD, or an OLED. Among such displays, the present invention is best embodied as an FED.

Figure 1B:
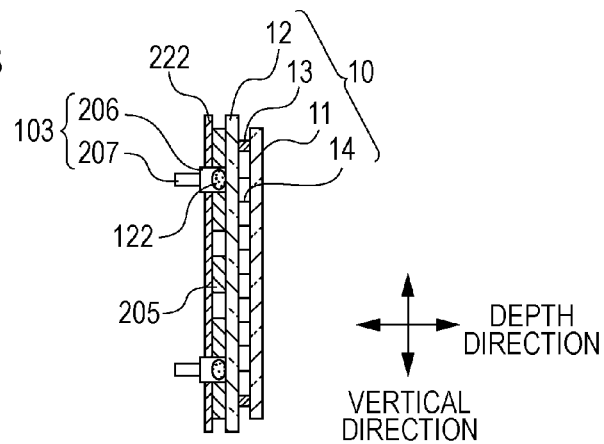
Figure 1C:
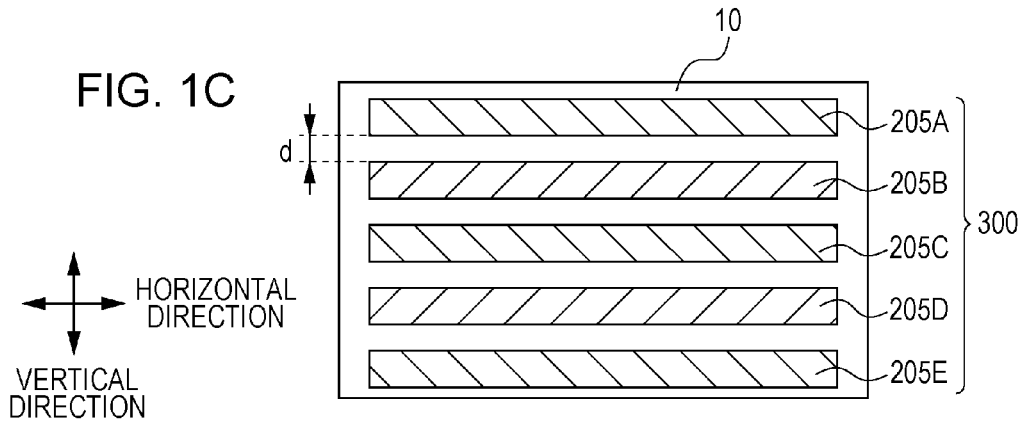

FIG. 1A schematically shows the display panel 210 seen from the rear. FIG. 1B is a schematic cross-sectional view of the display panel 210 shown in FIG. 1A, taken along the line IB-IB. FIG. 1C schematically shows the display panel 210 shown in FIG. 1A in a state where securing members 103, a thin plate 222 provided with the securing members 103, and bonding members 122 that bond the securing members 103 to the rear of an airtight casing 10 are removed. In the embodiment shown in FIGS. 1A to 1C, the display panel 210 has a thermally conductive member 300 on the rear of the airtight casing 10 forming the display panel 210. In the embodiment, the thermally conductive member 300 includes a plurality of thermally conductive structures 205A to 205E that are provided in contact with the rear of the airtight casing 10. The securing members 103 are bonded to the rear of the airtight casing 10 with the bonding members 122 provided therebetween. A drive circuit board (not shown) can be provided on the thin plate 222, which is provided integrally with the securing members 103. The thin plate 222 may either be in contact with the thermally conductive structures 205A to 205E or face the thermally conductive structures 205A to 205E with a gap interposed therebetween. If the thin plate 222 is provided in contact with the thermally conductive structures 205A to 205E, a thermally insulating member may be provided between the thin plate 222 and the thermally conductive structures 205A to 205E so that a desired thermal conductivity, described below, of the thermally conductive member 300 is not affected. In the embodiment in which the thin plate 222 is provided in direct contact with the thermally conductive structures 205A to 205E or a thermally insulating member or the like is interposed therebetween, the thermally conductive structures 205A to 205E can be pressed against the airtight casing 10 with the thin plate 222. Thus, the embodiment sufficiently demonstrates the beneficial effect of the present invention.

Herein, the display panel denotes a display module and includes at least the airtight casing 10 and the thermally conductive member 300, which will be described in detail separately below. The display panel also includes the securing members 103 that secure the airtight casing 10 to a support 108, described below, and the bonding members 122 that bond the securing members 103 to the airtight casing 10. Furthermore, light-emitting devices (liquid crystal devices if the display panel is an LCD) are provided in the airtight casing 10. Therefore, the display panel also includes a drive circuit (not shown) that drives the light-emitting devices. The image display apparatus denotes an apparatus including the display panel and the support 108 with which the display panel is fixed on an installation surface with the securing member interposed between the display panel and the support 108. According to need, the image display apparatus may also include a receiver that receives a television signal, an image-processing circuit that performs specific processing on an image signal that is input thereto in accordance with the characteristics of the display panel, a speaker, and so forth.

Figure 5A:
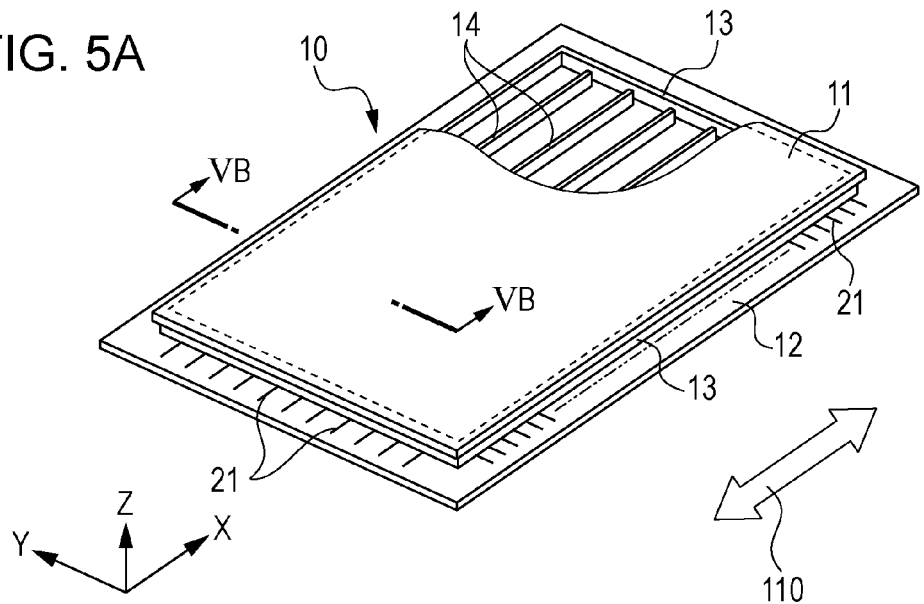
FIGS. 5A to 5C schematically show an exemplary configuration of an FED.
Figure 5B:
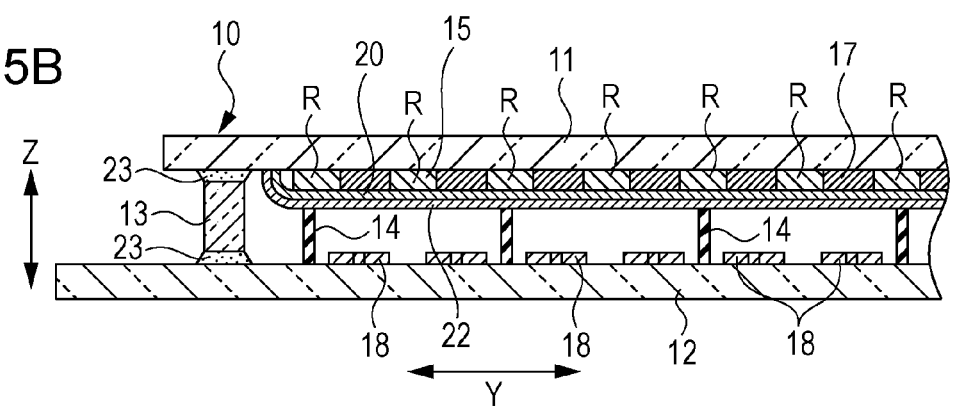
Figure 5C:
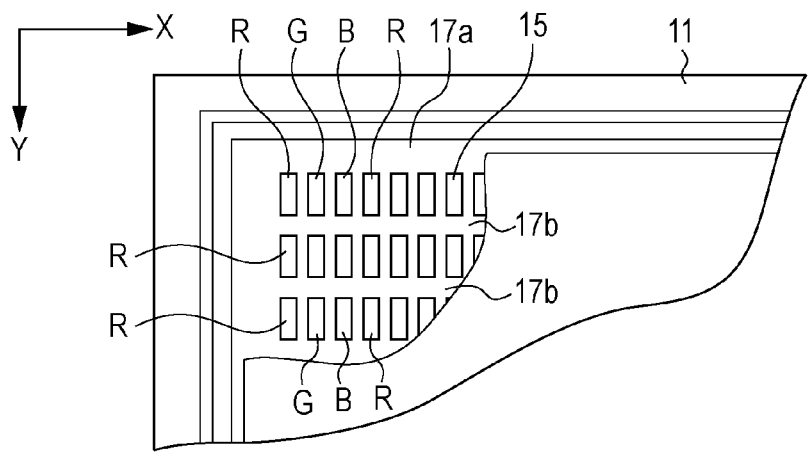

Referring now to FIGS. 5A to 5C, a field emission display (FED) to which the present invention is applicable will be described. An FED includes a flat, rectangular airtight casing 10 as shown in FIG. 5A. The pressure inside the flat, rectangular airtight casing 10 is maintained to be lower than the atmospheric pressure. In a case of a PDP, an LCD, or an OLED, the airtight casing 10 is filled with a noble gas, a liquid crystal material, or an inert gas.

A plurality of long, narrow, plate-like spacers 14 extending in a spacer longitudinal direction 110 are provided between a front substrate 11 and a rear substrate 12 that form the airtight casing 10. The spacer longitudinal direction 110 corresponds to the longitudinal direction of the flat, rectangular airtight casing 10 (a first direction X).

FIG. 5A is a schematic perspective view of the airtight casing 10 forming the display panel, with part thereof being cut away. FIG. 5B is a schematic cross-sectional view taken along the line VB-VB in FIG. 5A. FIG. 5C schematically shows part of a surface of the front substrate 11 near the rear substrate 12 seen from the side of the rear substrate 12. As shown in FIG. 5A, the airtight casing 10 includes the front substrate 11 and the rear substrate 12 each made of a rectangular glass substrate. The front substrate 11 and the rear substrate 12 face each other with a gap of 1 to 2 mm interposed therebetween in a third direction Z. The front substrate 11 and the rear substrate 12 each have a thickness of 0.5 to 3 mm, or may be 2 mm or smaller. The front substrate 11 and the rear substrate 12 are joined together at the peripheries thereof with a rectangular frame-like sidewall 13 interposed therebetween, whereby the flat, rectangular airtight casing 10 in which the space between the front substrate 11 and the rear substrate 12 is sealed is provided. In the FED, the pressure inside the airtight casing 10 is maintained to be lower than the atmospheric pressure, i.e., vacuum, specifically, a high vacuum of about $10^{-4}$ Pa or lower.

The gap (the distance in the third direction Z) between the front substrate 11 and the rear substrate 12 is maintained to be, for example, 200 µm or larger and 3 mm or smaller, more practically, 1 mm or larger and 2 mm or smaller. The sidewall 13 is made of glass or metal, for example. Bonding members 23 may be a bonding agent having a sealing function, such as low-melting glass or low-melting metal. The bonding members 23 bond the front and rear substrates 11 and 12 and the sidewall 13 together, whereby the front substrate 11 and the rear substrate 12 are airtightly joined to each other at the peripheries thereof. In the embodiment, the sidewall 13 and the bonding members 23 form a joining member. Alternatively, depending on the length of the gap between the front substrate 11 and the rear substrate 12, the sidewall 13 may be omitted. That is, the configuration of the joining member is not limited, as long as they can join the front substrate 11 and the rear substrate 12 together with an airtightly enclosed space provided therebetween.

Referring now to FIG. 5B, a light-emitting-member layer 15 is provided on the inner surface of the front substrate 11. The light-emitting-member layer 15 includes light-emitting members R, G, and B, such as phosphors, that emit red, green, and blue lights, respectively, and a matrix-shaped light-shielding member 17. The light-shielding member 17 is also called a black matrix. A metal back layer 20 is provided on the light-emitting-member layer 15. The metal back layer 20 is mainly made of aluminum, for example, and functions as an anode electrode. Optionally, a getter film 22 may be further provided on the metal back layer 20. During a display operation, a specific anode voltage is applied to the metal back layer 20. The metal back layer 20 is maintained to have a voltage of 10 to 15 kV, for example, depending on the gap between the front substrate 11 and the rear substrate 12 and the required brightness of an image to be displayed.

A number of electron-emitting devices 18 are provided on a surface (inner surface) of the rear substrate 12 near the front substrate 11. The electron-emitting devices 18 function as sources of electrons that excite the light-emitting members R, G, and B included in the light-emitting-member layer 15, and emit electron beams. The electron-emitting devices 18 are arranged in a matrix in correspondence with pixels, i.e., the light-emitting members R, G, and B. The electron-emitting devices 18 may be surface-conduction electron-emitting devices, field-emission electron-emitting devices, or the like. A number of wires 21 through which the electron-emitting devices 18 are driven are provided on the inner surface of the rear substrate 12 in a matrix arrangement. The ends of the wires 21 are on the outside of the airtight casing 10.

The plurality of long, narrow, plate-like spacers 14 provided between the front substrate 11 and the rear substrate 12 bear the atmospheric pressure acting on the front and rear substrates 11 and 12. When the longitudinal direction (the long-side direction) of the front substrate 11 and the rear substrate 12 is defined as the first direction X, and the direction orthogonal thereto (the widthwise or short-side direction) is defined as a second direction Y, the spacers 14 extend in the first direction X. In other words, the spacer longitudinal direction 110 corresponds to the first direction X.

The spacers 14 are arranged side by side in the second direction Y at specific intervals. The interval in the second direction Y is 1 to 50 mm, for example. As described separately below, the spacers 14 are made of glass or ceramic plates that are long and narrow. The spacers 14 can be provided in such a manner as to each cross an image display area with both ends thereof in the longitudinal direction 110 (the first direction X) being on the outside of the image display area. Basically, at least one end of each spacer 14 in the longitudinal direction 110 is on the outside of the image display area. That is, the spacers 14 each extend over the image display area and the area outside the image display area.

The spacers 14 have a specific resistance so that the surfaces thereof are prevented from being statically charged with electrons scattered from the anode electrode and electrons emitted from the electron-emitting devices 18. If the resistance of the spacers 14 is too low, an excessive amount of current may flow from the front substrate 11 to the rear substrate 12 through the spacers 14, resulting in an increase in the power consumption of the image display apparatus. If an excessive amount of current flows across the spacers 14, the spacers 14 generate heat. Moreover, since the temperature coefficient of resistance (TCR) of the material for the spacers 14 is a negative value, the resistance of the spacers 14 is reduced in accordance with the coefficient. Consequently, an additional amount of current flows across the spacers 14, resulting in the possibility of more heat generation called thermal runaway. In contrast, if the resistance of the spacers 14 is too high, the speed at which positive charges accumulated on the surfaces of the spacers 14 are removed may be reduced, resulting in the possibility of reduction in withstanding pressure and image quality due to static charge.

Practically, the sheet resistance of the spacers 14 is set to be $1 \times 10^{11}$ Ω/square or higher and $1 \times 10^{14}$ Ω/square or lower. The sheet resistance of the spacers 14 is measured as follows, for example. First, a portion of a spacer 14 is cut out, whereby a piece of spacer having a square shape or the like is obtained. Then, a pair of electrodes are placed across the piece of spacer, and the resistance R of the piece of spacer is measured. The sheet resistance of the spacer 14 is calculated from the distance h between the pair of electrodes and the width d of a portion of the piece of spacer where the electrodes are placed, specifically, R×d/h. Considering the width d, the piece of spacer is to be cut out such that the width of a portion thereof where one of the electrodes is placed and the width of a portion thereof where the other electrode is placed are the same.

To obtain the sheet resistance described above, the spacers 14 are to be provided as electrically insulating plates made of glass or the like covered with an electrically conductive film having a high resistance. The electrically conductive film is composed of metallic oxide, for example. Oxides of chromium, nickel, or copper may also be used. This is because such oxides have relatively low efficiencies of secondary electron emission, and the amount of static charge generated at an impact of electrons from the electron-emitting devices 18 onto the spacers 14 is therefore small. Other than metal oxides, carbon may also be used because of its low efficiency of secondary electron emission. In particular, with amorphous carbon, which has a high resistance, the resistance of the spacers 14 can be easily controlled to be a desired value. The spacers 14 may alternatively be made of cermet, which is a compound of ceramic and electrically conductive material. Exemplary ceramic materials include an aluminum silicate compound such as mullite, aluminum oxide such as alumina, barium titanate, lead zirconate titanate, zirconia (zirconium oxide), cordierite, barium borosilicate, iron silicate, and glass ceramic. Exemplary electrically conductive materials to be added to such a ceramic material include titanium oxide, chromium oxide, magnesium oxide, iron oxide, vanadium oxide, and nickel oxide.

The spacers 14 have a height (the dimension in the third direction Z) that is several to tend-odd times larger than the width (the dimension in the second direction Y) thereof, and a length (the dimension in the first direction X) that is ten-odd to several hundred times larger than the height thereof.

To display an image on the display panel and image display apparatus including the airtight casing 10, an anode voltage is applied to the light-emitting members R, G, and B through the metal back layer 20. Meanwhile, electron beams emitted from relevant ones of the electron-emitting devices 18 are accelerated with the anode voltage and are made to strike onto corresponding ones of the light-emitting members R, G, and B. In response to this, the corresponding light-emitting members R, G, and B are excited and emit respective lights, whereby a color image is displayed. In the FED, a light-emitting device includes an electron-emitting device, a light-emitting member that emits light by receiving electrons emitted from the electron-emitting device, and an anode electrode.

Referring now to FIG. 5C, the light-emitting-member layer 15 includes a number of rectangular light-emitting members R, G, and B that emit red, blue, and green lights, respectively. The light-emitting members R, G, and B are arranged in that order in the first direction X at specific intervals, whereas the light-emitting members of the same color are arranged in the second direction Y at specific intervals. The interval in the first direction X is smaller than the interval in the second direction Y. The light-shielding member 17 includes a rectangular frame portion 17a extending along the periphery of the front substrate 11 and a matrix portion 17b patterned in a matrix shape on the inner side of the frame portion 17a, individual segments of the matrix portion 17b extending between the light-emitting members R, G, and B. When an image is displayed, usually, the first direction X corresponds to the horizontal direction, the second direction Y corresponds to the vertical direction, and the third direction Z corresponds to the depth direction, the horizontal, vertical, and depth directions being indicated in FIGS. 1A to 1C.

Referring now to FIG. 1C, the thermally conductive member 300 will be described. In the embodiment, the thermally conductive member 300 includes a plurality of thermally conductive structures 205A to 205E connected to the rear of the airtight casing 10 and arranged at specific intervals in the vertical direction. The thermally conductive structures 205A to 205E are not particularly limited, as long as they are made of a material having a thermal conductivity higher than that of the rear substrate 12 of the airtight casing 10. For example, the thermally conductive structures 205A to 205E may be graphite sheets.

The thermally conductive structures 205A to 205E extend in the horizontal direction. That is, the thermally conductive structures 205A to 205E are thin plates (sheets) whose longitudinal direction corresponds to the horizontal direction. The configuration shown in FIG. 1C includes five thermally conductive structures 205A to 205E. The number of thermally conductive structures is determined appropriately in accordance with the size of the airtight casing 10. Usually, three or more thermally conductive structures are provided. Needless to say, the thermally conductive structures have a thermal conductivity higher than that at the rear (the rear substrate 12 in the embodiment) of the airtight casing 10. The thermally conductive structures (205A to 205E) are to be thermally connected to the rear of the airtight casing 10. Practically, the thermally conductive structures are in contact with the rear of the airtight casing 10.

The thermal conductivity of the thermally conductive member 300 in any of the horizontal direction (the direction corresponding to the spacer longitudinal direction 110), the vertical direction (the gravitational direction), and the thickness direction (the depth direction) is different from that in the other directions. That is, the thermally conductive member 300 has anisotropic thermal conductivity. Thus, the flow of heat is controlled. Specifically, the thermal conductivity of the thermally conductive member 300 is the highest in the horizontal direction, moderate in the vertical direction, and the lowest in the depth direction. The absolute values of thermal conductivity in the respective directions are not particularly specified, provided that the foregoing relationship of thermal conductivity is maintained.

When an image is displayed, the temperature of the front substrate 11 of the display panel 210 (airtight casing 10) is higher in the upper portion thereof than in the lower portion thereof in the vertical direction because of a cooling effect produced by natural convection.

The thermally conductive member 300 having a higher thermal conductivity in the horizontal direction than in the vertical direction contributes to the realization of a configuration in which thermal transfer in the vertical direction between the upper and lower portions of the rear substrate 12 is suppressed.

Such a configuration is realized by, for example, providing a plurality of thermally conductive structures (205A to 205E) such that the longitudinal direction thereof corresponds to the horizontal direction and that the structures are spaced apart from one another in the vertical direction, as shown in FIG. 1C. By providing the thermally conductive structures in such a manner as to be spaced apart from one another, gaps (air gaps) are provided between thermally conductive structures adjacent to one another in the vertical direction. The gaps (air gaps) extending in the spacer longitudinal direction 110 (the horizontal direction) reduce the thermal conductivity of the thermally conductive member 300 in the vertical direction. Instead of providing such gaps between the thermally conductive structures, the thermally conductive structures may be connected to one another with additional members (thermally insulating members, for example) interposed therebetween, the additional members having a lower thermal conductivity than the thermally conductive structures. In either way, the thermal conductivity of the thermally conductive member 300 is made higher in the horizontal direction than in the vertical direction.

Thus, the temperature variation occurring in the rear substrate 12 in the vertical direction is controlled to be approximate to the temperature variation occurring in the front substrate 11 in the vertical direction. In addition, the temperature variation occurring in the rear substrate 12 in the horizontal direction is reduced.

Consequently, although there are in-plane temperature variations on the rear substrate 12, the temperature differences between regions of the front substrate 11 and corresponding regions of the rear substrate 12 facing thereto are reduced. That is, the temperature difference between the front substrate 11 and the rear substrate 12 does not vary significantly with the set of positions, on the front substrate 11 and on the rear substrate 12, that are in proximity to each other. Therefore, the airtight casing 10 is provided with high reliability.

Figure 6:
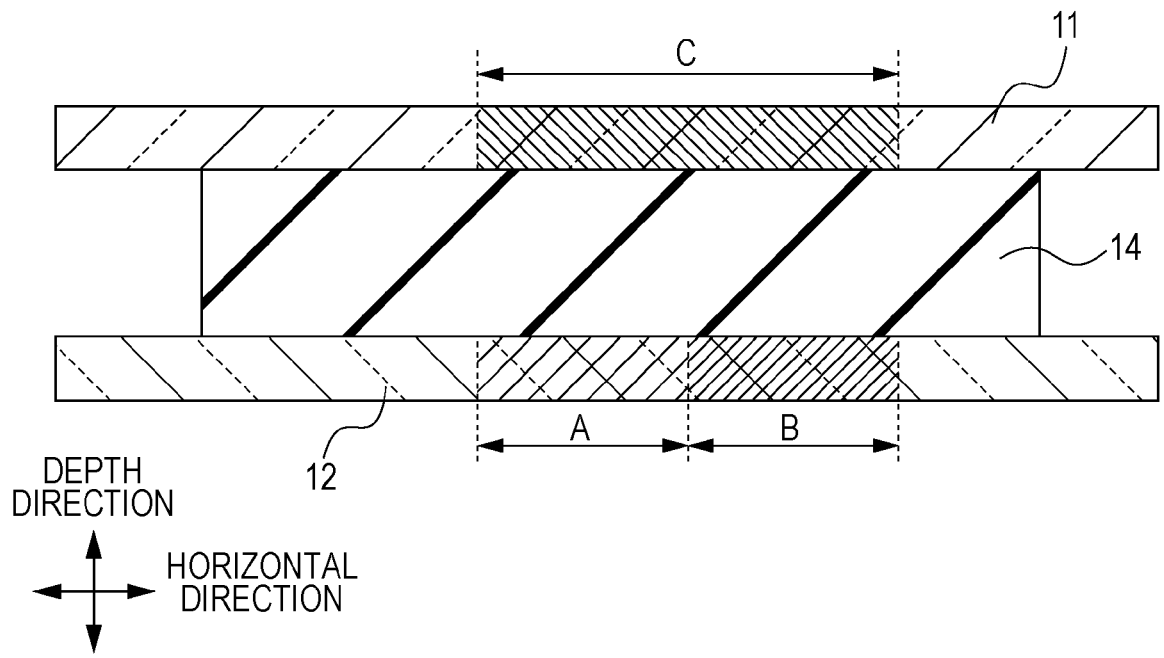
FIG. 6 is a diagram for describing temperature variations occurring on the front and rear sides of a spacer.

In the case of the FED, the temperature difference between the front substrate 11 and the rear substrate 12 is prevented from significantly varying with the set of positions, on the front and rear substrates 11 and 12, that face each other with a spacer 14 interposed therebetween. This effect will now be described with reference to FIG. 6. FIG. 6 is a schematic cross-sectional view of part of the airtight casing 10 taken along a line extending in the horizontal direction. For example, focusing on a region C of the front substrate 11 and regions A and B of the rear substrate 12 that face the region C, suppose that the temperature in the region A differs from the temperature in the region B. In such a case, the temperature difference affecting a portion of a spacer 14 held between the region B and the region C differs from the temperature difference affecting another portion of the spacer 14 held between the region A and the region C. Accordingly, the resistance of the spacer 14 in the portion thereof held between the region B and the region C may differ from the resistance of the spacer 14 in the portion thereof held between the region A and the region C. This may produce a situation in which the trajectories of electrons emitted from electron-emitting devices 18 provided near the region B differ from the trajectories of electrons emitted from electron-emitting devices 18 provided near the region A. Consequently, a good image may not be displayed.

In contrast, in the embodiment of the present invention, the thermally conductive member 300 includes the thermally conductive structures 205A to 205E extending in the spacer longitudinal direction 110. Thus, the temperature difference that varies with the set of regions of the front substrate 11 and the rear substrate 12 that face each other with the spacer 14 interposed therebetween is reduced. Accordingly, unintentional deflection of the trajectories of electrons emitted from the electron-emitting devices 18 is suppressed. Consequently, an image display apparatus capable of displaying a good image over a long period of time is obtained.

The thermal conductivity of the thermally conductive member 300 in the depth direction is set to be relatively the lowest so that heat from the airtight casing 10 and the drive circuit board (not shown), which are heat sources, is diffused preferentially in the horizontal and vertical directions while heat diffusion in the depth direction is suppressed.

As described above, the temperature of the front substrate 11 inevitably becomes higher toward the top thereof in the vertical direction (a direction parallel to the direction of gravitational force). Meanwhile, if a thermally conductive member having isotropic thermal conductivity is provided in contact with and over the entirety of the rear surface of the rear substrate 12, as in the configuration disclosed in Japanese Patent Laid-Open No. 2002-156913, the temperature variation in the rear substrate 12 is reduced both in the vertical and horizontal directions. Consequently, a situation arises in that the temperature of the rear substrate 12 is lower than that of the front substrate 11 in the upper portion of the display panel but is higher than that of the front substrate 11 in the lower portion of the display panel in the vertical direction (a direction parallel to the direction of gravitational force). To solve this, in the embodiment of the present invention, the thermal conductivity of the thermally conductive member 300 in the vertical direction is set to be relatively lower than that in the horizontal direction so that the difference in temperature variation in the vertical direction between the front substrate 11 and the rear substrate 12 is reduced.

Figure 3A:
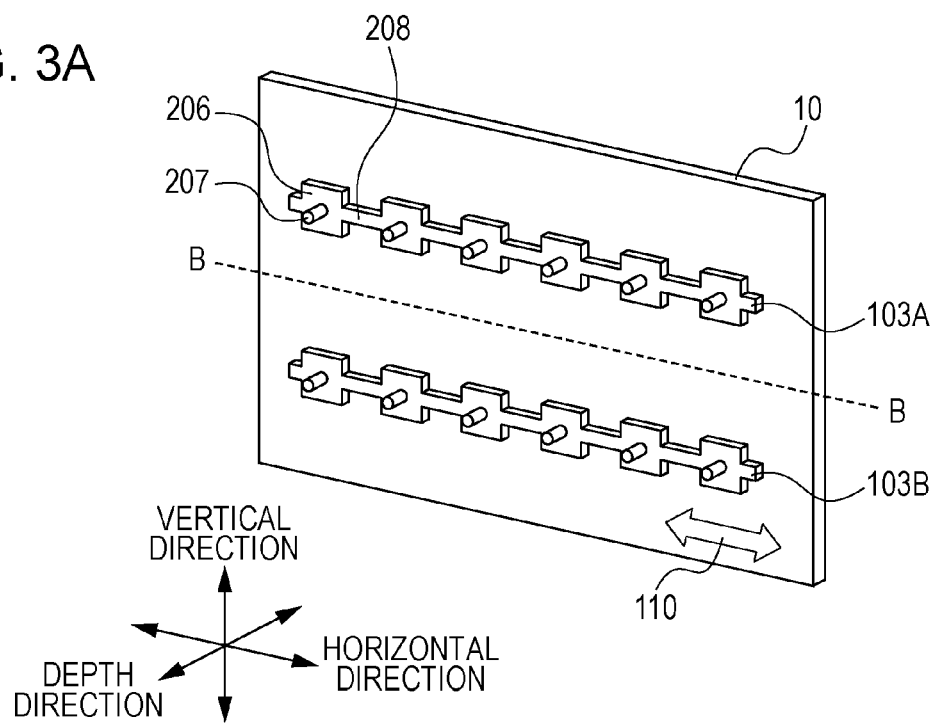
FIGS. 3A and 3B schematically show the display panel and an image display apparatus, respectively.
Figure 3B:
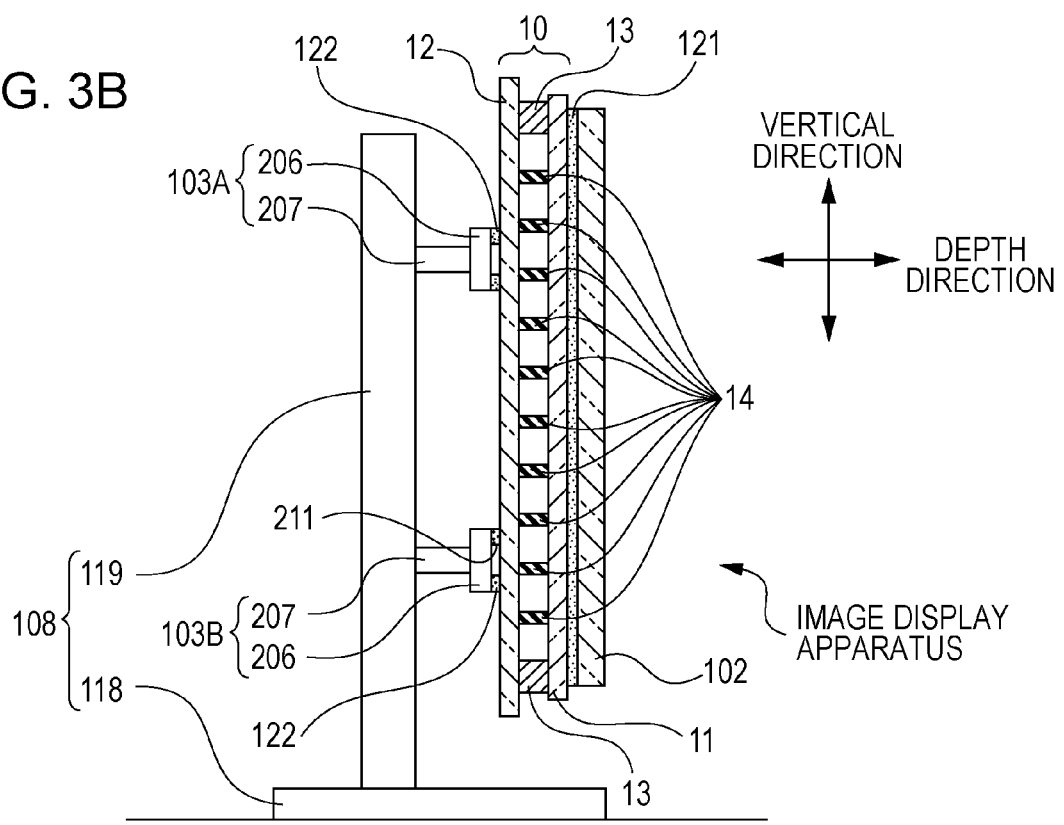

Referring now to FIGS. 1A, 1B, 3A, and 3B, the securing members 103 will now be described. FIG. 3A is a schematic perspective view of the display panel 210 shown in FIG. 1A, with the thin plate 222 removed therefrom and seen obliquely from the rear. FIG. 3B is a schematic cross-sectional view of an image display apparatus obtained by attaching the support 108 to the display panel 210 shown in FIG. 3A, containing a cross section taken along the line IIIB-IIIB in FIG. 1A. In FIG. 3B, a front panel 102, which is not shown in FIGS. 1A and 1B, is shown on the front substrate 11.

The front panel 102 is bonded to the front (the surface remote from the rear substrate 12) of the front substrate 11 of the airtight casing 10 with a bonding member 121 provided therebetween. The longitudinal directions of the front panel 102 and the display panel 210 correspond to the spacer longitudinal direction 110. Thus, deformation and stress concentration occurring in the spacer longitudinal direction 110 are reduced. The front panel 102 is a flat plate and is to have a larger area than the image display area (the area in which the light-emitting members R, G, and B are provided) of the display panel 210 (airtight casing 10). The front panel 102 is made of a material transparent to visible light, for example, glass or polycarbonate. In terms of optical characteristics, glass is superior. The thickness of the front panel 102, if made of glass, is approximately 1.5 to 3.5 mm so that a specific level of strength is provided to the airtight casing 10. In view of the strength, the front panel 102 may be thicker than each of the front substrate 11 and the rear substrate 12.

The material, shape, thickness, area, and so forth of the bonding member 121 are determined appropriately, considering the strength, shock absorbency, and thermal conductivity of the bonding member 121, the flatness of the front panel 102, and so forth. The bonding member 121 is not particularly limited but may be a bonding agent that does not need to be heated to a high temperature in bonding the front panel 102 to the airtight casing 10 after the airtight casing 10 is prepared. For example, the bonding member 121 may be an ultraviolet (UV)-curable resin bonding agent capable of bonding the front panel 102 and the airtight casing 10, both made of glass, together by being exposed to ultraviolet rays at room temperature. More specifically, the bonding member 121 may be an acrylic UV-curable resin bonding agent.

By bonding the front panel 102 to the airtight casing 10 with the bonding member 121, the rigidity, in particular, the rigidity to surface torsion, of the airtight casing 10 is increased. Thus, the thickness and weight of a reinforcing member, such as a reinforcing frame, provided on the rear surface of the rear substrate 12 in the known art can be significantly reduced.

In the embodiment shown in FIGS. 1A and 3A, the plurality of securing members 103 capable of securing the display panel 210 (airtight casing 10) to the support 108, which is a rigid body, include two linear securing members 103A and 103B that are spaced apart from each other. The securing members 103 are basically provided in the form of metal thin plates and are therefore flexible. The linear securing members 103A and 103B are arranged such that the longitudinal direction thereof corresponds to the spacer longitudinal direction 110 (horizontal direction). Thus, deformation of the spacers 14 and stress concentration (described in detail below) to the portions at which the spacers 14 are in contact with the front substrate 11 are reduced. The securing members 103 do not substantially have a function of reinforcing the airtight casing 10, unlike the reinforcing frame provided on the rear of the airtight casing in the known art. Instead, the front panel 102 is responsible for providing rigidity, in particular, rigidity to surface torsion, to the airtight casing 10.

The securing members 103 are arranged such that one of the securing members 103 (the securing member 103A) is line-symmetrical to the other (the securing member 103B) with respect to a center line (the line B-B in FIG. 3A) of the image display area (or the rear substrate 12), the center line extending in the horizontal direction (the first direction X indicated in FIG. 5A). Furthermore, each of the securing members 103 has a line-symmetrical shape with respect to another center line (the line A-A in FIG. 1A) of the image display area (or the rear substrate 12), the center line extending in the vertical direction (the second direction Y indicated in FIG. 5A). That is, the shape of each securing member 103 is obtained by reflecting a specific shape about the vertically extending center line (the line A-A in FIG. 1A) of the image display area. While the embodiment concerns a case where two securing members 103A and 103B are provided, at least two securing members only need to be provided. When an odd number (three, for example) of securing members 103 are provided, one of the securing members 103 is bonded to the rear substrate 12 in such a manner as to extend on the horizontally extending center line (the line B-B in FIG. 3A) of the image display area of the airtight casing 10, and the other two are bonded to the rear substrate 12 at positions spaced apart from the one provided on the foregoing center line (the line B-B in FIG. 3A) such that the conditions on the arrangement and shape thereof described above are satisfied.

The securing members (103A and 103B) are each provided between adjacent ones of the thermally conductive structures (205A to 205E). In the embodiment shown in FIGS. 1A to 1C, the securing member 103A is provided between the thermally conductive structures 205A and 205B, and the securing member 103B is provided between the thermally conductive structures 205D and 205E. Such an arrangement is only exemplary. That is, in the case where the thermally conductive member 300 includes a plurality of linear thermally conductive structures, each of the securing members 103 is provided between any two of the thermally conductive structures that are adjacent to each other in the vertical direction.

Each of the securing members (103A and 103B) includes a thin plate member (including portions 206 and 208) and projections 207 provided on the plate member. The projections 207 function as support points. In the embodiment shown in FIGS. 1A, 3A, and 3B, the plate member includes large-width portions 206 and small-width portions 208 that are alternately connected to one another. The projections 207 are provided on a surface of the plate member (including the portions 206 and 208) opposite the surface bonded to the rear substrate 12. In the embodiment, the projections 207 are provided on the large-width portions 206. With such a configuration, the support 108, which is a rigid body, and the securing members 103 are secured to each other, whereby the display panel 210 (airtight casing 10) is secured to the support 108. The plate member and the projections 207 are firmly connected to each other by any method such as caulking, press-bonding, welding, and bonding. The width, i.e., area, of each plate member at least at the portions on which the projections 207 are provided (the portions directly below the projections 207) is set to be larger than the width, i.e., area, of the base of each projection 207 (a portion of each projection 207 connected to the plate member). This is to reduce the stress applied to the airtight casing 10 when an impact is given to the airtight casing 10 through the projections 207.

The plate members (including the portions 206 and 208) and the projections 207 are, for example, made of metal such as aluminum, iron, or magnesium, or an alloy of such metals. Benefits of employing metal-made plate members (including the portions 206 and 208) and projections 207 are as follows:

Usable as members that ground the electric circuit and the display panel

Superior in the flame-retarding characteristic

If the plate members are formed by presswork, good flatness is obtained at a low cost. The projections 207 function as gap-determining members and may each have any shape such as a round columnar shape, a quadrangular prism shape, or a polygonal prism shape. Furthermore, the projections 207 may be formed by header processing, machining, or the like. Moreover, the projections 207 may be processed into internal threads so as to function as support points. In such a case, the securing members 103 firmly bonded to the airtight casing 10 is secured to the support 108 with screws. If each plate member and the projections 207 are assembled and are subjected to presswork, caulking or press-bonding at a plurality of positions are performed at a time. This reduces the number of steps in the manufacturing process. Consequently, the cost of manufacturing the securing members 103 is reduced.

The thin plate 222 shown in FIG. 1A may also be a thin metal plate. Alternatively, the thin plate 222 may be omitted. If the thin plate 222 is provided, the thin plate 222 is bonded to the plate members by welding or the like, thereby being secured.

The bonding members 122 may be two-sided adhesive tape, a bonding agent, or the like. The material, shape, thickness, area, and so forth of the bonding members 122 are appropriately determined, considering the strength, shock absorbency, and thermal conductivity of the bonding members 122, the flatness of the securing members 103, and so forth. The bonding members 122 can have the same shape as the securing members 103 and are provided on the airtight casing 10. That is, the bonding members 122 can be provided such that the longitudinal direction thereof corresponds to the spacer longitudinal direction 110. Thus, the deformation and stress concentration occurring on the spacers 14 are reduced.

The bonding members 122 may have hollows 211, as shown in FIG. 3B, so that stress concentration occurring on the airtight casing 10 when any impact of dropping or the like is given to the securing members 103 is reduced. The hollows 211, also referred to as holes 211, extend between the airtight casing 10 (rear substrate 12) and the securing members 103. For example, the hollows (holes) 211 extend between the airtight casing 10 (rear substrate 12) and portions of the securing members 103 having the projections 207, that is, the hollows (holes) 211 are provided below the projections 207.

The support 108 supports the display panel 210 such that the surface of the front substrate 11 near the rear substrate 12 extends in the gravitational direction (the vertical direction) when the display panel is oriented so as to display an image. In the embodiment, the support 108 includes a support base (base) 118 and a post 119 provided upright on the support base 118. More specifically, the support base (base) 118 provides an installation surface at which the image display apparatus is installed on, for example, a desk or an audio rack. The post 119 stands upright on the support base 118 so that the display surface of the display panel 210 is held vertically with respect to the installation surface. The post 119 is secured at the basal portion thereof to the support base 118. The support base 118 and the post 119 may be removably joined to each other with a screw or the like. The support 108 may include an angle adjuster so that the angle of the display surface with respect to the post 119 can be adjusted in the horizontal and vertical directions. Furthermore, a rotating mechanism allowing the post 119 to rotate may be added to the basal portion of the post 119 or the support base 118. While the embodiment concerns a case where the support base 118 and the post 119 are separate members, the support base 118 and the post 119 may be provided as an integral body. Moreover, a plurality of posts 119 may be provided. The configuration of the support 108 is not particularly limited, as long as the image display apparatus can be installed stably. Therefore, if, for example, the image display apparatus is directly fixed on a wall, the member equivalent to the support base 118 and/or the member equivalent to the post 119 may be omitted.

Figure 7A:
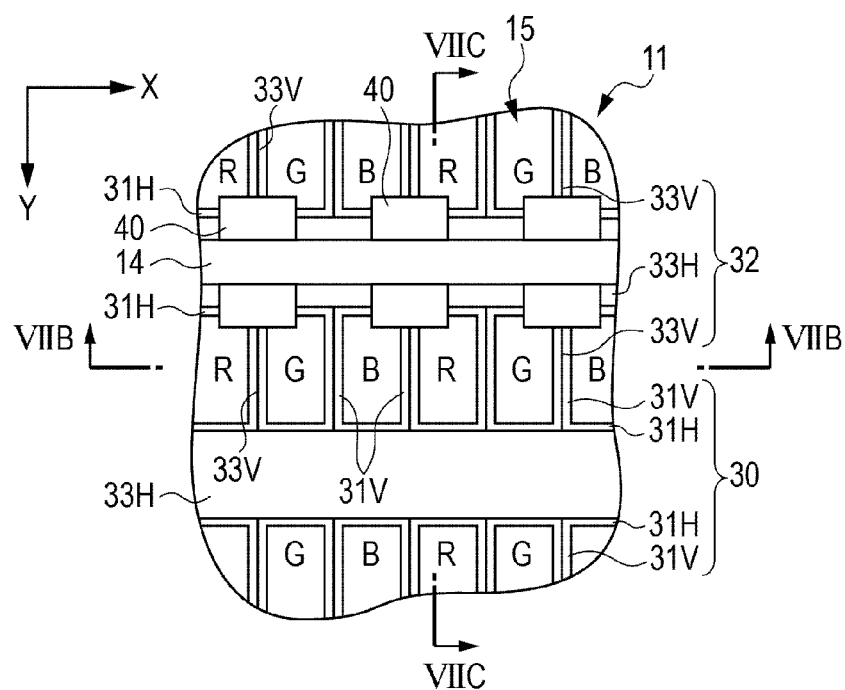
FIGS. 7A to 7C schematically show a front substrate of the FED and relevant elements provided thereon.
Figure 7B:
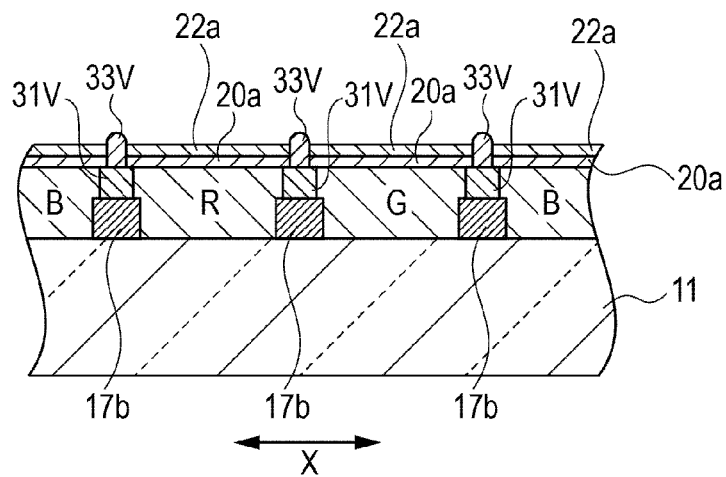
Figure 7C:
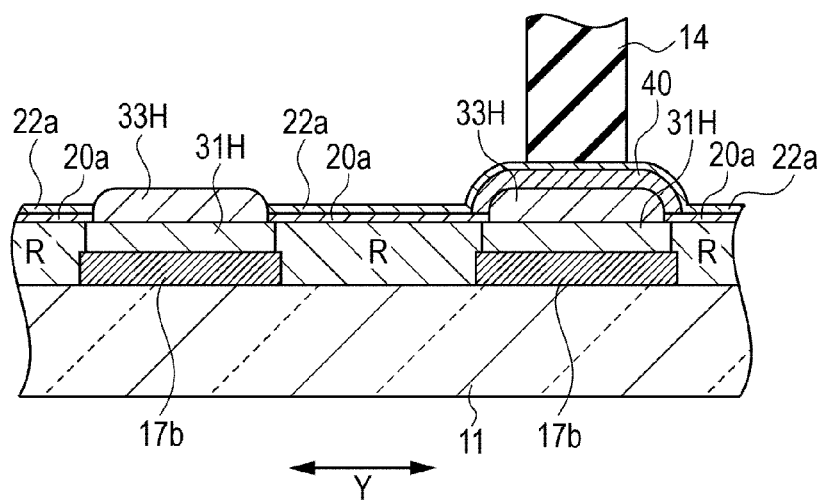

The front substrate 11 that is in contact with the spacers 14 will now be described. The light-shielding member 17 shown in FIGS. 5B and 5C may be covered with a resistance-adjusting layer 30. FIGS. 7A to 7C schematically show details of the front substrate 11. The resistance-adjusting layer 30 includes, over the matrix portion 17b of the light-shielding member 17, a plurality of first resistance-adjusting segments 31V extending in the second direction Y between the light-emitting members R, G, and B adjacent to one another in the first direction X, and a plurality of second resistance-adjusting segments 31H extending in the first direction X between the light-emitting members R, G, and B adjacent to one another in the second direction Y. Since the light-emitting members are arranged in the order of R, G and B in the first direction X, the first resistance-adjusting segments 31V have a smaller width than the second resistance-adjusting segments 31H.

For example, the first resistance-adjusting segments 31V have a width of 40 μm, and the second resistance-adjusting segments 31H have a width of 300 μm. FIG. 7B is a cross-sectional view taken along the line VIIB-VIIB in FIG. 7A. FIG. 7C is a cross-sectional view taken along the line VIIC-VIIC in FIG. 7A.

A thin-layer-dividing layer 32 is provided on the resistance-adjusting layer 30. The thin-layer-dividing layer 32 includes a plurality of vertical segments 33V provided on the first resistance-adjusting segments 31V, respectively, of the resistance-adjusting layer 30, and a plurality of horizontal segments 33H provided on the second resistance-adjusting segments 31H, respectively, of the resistance-adjusting layer 30. The thin-layer-dividing layer 32 is composed of particles and a binder, the particles being dispersed at an appropriate density such that the surface of the thin-layer-dividing layer 32 has irregularities. Thus, the thin-layer-dividing layer 32 divides a thin film (the metal back layer 20) to be formed by depositing or the like after the thin-layer-dividing layer 32 is formed. The particles contained in the thin-layer-dividing layer 32 are phosphors, silica, or the like. The segments 33V and 33H of the thin-layer-dividing layer 32 have widths a little smaller than those of the segments of the light-shielding member 17. For example, the horizontal segments 33H have a width of 260 μm, and the vertical segments 33V have a width of 20 μm.

After the thin-layer-dividing layer 32 is formed, smoothing with lacquer or the like is performed so that the metal back layer 20 can have a smooth surface. The film formed in the smoothing is burned out by firing performed after the metal back layer 20 is formed.

After the smoothing, the metal back layer 20 is formed by a thin-film-forming process such as deposition. Thus, divided metal-back segments 20a are obtained that are the resultant of two-dimensional division of the metal back layer 20 by the thin-layer-dividing layer 32 in the first direction X and in the second direction Y. The divided metal-back segments 20a overlie the light-emitting members R, G, and B, respectively. In the embodiment, the intervals between the divided metal-back segments 20a are substantially the same as the widths of the horizontal segments 33H and the vertical segments 33V of the thin-layer-dividing layer 32, specifically, 20 μm in the first direction X and 260 μm in the second direction Y. To avoid complexity, the metal back layer 20 is not shown in FIG. 7A.

Optionally, a getter film 22 may further overlie the metal back layer 20. In some FEDs, the getter film 22 needs to be provided on the metal back layer 20 so that a certain degree of vacuum is maintained over a long period of time. Even after the metal back layer 20 is formed, the effect of the thin-layer-dividing layer 32 is retained. Therefore, the getter film 22 is two-dimensionally divided into the same pattern as the metal back layer 20, whereby divided getter segments 22a are obtained.

Referring to FIGS. 7A and 7C, the spacers 14 are provided at some of the positions where the horizontal segments 33H of the thin-layer-dividing layer 32 are provided, with spacer-supporting films 40 interposed between the spacers 14 and the corresponding horizontal segments 33H. The spacer-supporting films 40 are formed by applying a paste containing silver particles or the like by printing and then firing the paste. Other than silver particles, particles of an electrically conductive material such as Pt or Au may also be used. As a matter of printing accuracy, very small patterns cannot be printed. Therefore, a single spacer-supporting film 40 slightly overlap at each of two ends thereof in the second direction Y with two light-emitting members and two corresponding divided metal-back segments 20a, that is, four light-emitting members and four corresponding divided metal-back segments 20a in total on both sides, in the second direction Y, of a corresponding one of the horizontal segments 33H. Furthermore, as shown in FIG. 7A, the spacer-supporting films 40 are provided intermittently at specific intervals in the first direction X and have a thickness adjusted such that the top surfaces thereof reside nearer to the rear substrate 12 than the top surface of the thin-layer-dividing layer 32. Thus, the spacers 14 are provided on the spacer-supporting films 40 with the getter film 22, if provided, interposed therebetween but without being in contact with the thin-layer-dividing layer 32.

Considering the possibility of contact with the spacers 14, prevention of static charge, and so forth, the spacer-supporting films 40 may be electrically conductive. However, an electrically insulating material is also acceptable for the spacer-supporting films 40. The thin-layer-dividing layer 32 and the resistance-adjusting layer 30 described in the embodiment may be omitted depending on the form of the metal back layer 20 and the method of manufacturing the metal back layer 20. In addition to the thin-layer-dividing layer 32 and the resistance-adjusting layer 30, the spacer-supporting films 40 may also be omitted. In such a case, the spacers 14 are in contact with the metal back layer 20, and the metal back layer 20 functions as a spacer-supporting layer.

As described above with reference to FIGS. 7A to 7C, the spacer-supporting films 40 may be interposed between the front substrate 11 and the spacers 14. In this case, the image display apparatus may be damaged when any impact is given to the apparatus from the outside, such as an impact occurring during transportation or at the time of installation or an impact of dropping due to mishandling. More specifically, the foregoing impact may cause a deformation of the airtight casing 10 with a bend convex or concave in the third direction Z, for example. Such a deformation may be accompanied by breakage of members, for example, the spacer-supporting films 40 or the metal back layer 20, provided on the front substrate 11 at positions where the spacers 14 are provided, because of shearing stress produced by the long, narrow, plate-like spacers 14. If the members, such as the spacer-supporting films 40 or the metal back layer 20, provided on the front substrate 11 at the positions where the spacers 14 are provided are broken, broken pieces of the members may fall onto the rear substrate 12, and an undesired electric discharge may occur between the metal back layer 20 and some electron-emitting devices 18 and/or between the divided metal-back segments 20a. Consequently, the image display apparatus may not work appropriately, or the image display quality may be deteriorated significantly.

In contrast, in the display panel 210 shown in FIG. 3B, the front panel 102 is bonded to the front substrate 11, and the linear securing members 103 are provided in such a manner as to extend in the spacer longitudinal direction 110 (see FIGS. 1A and 3A). Therefore, even if any impact such as those described above is given to the support 108 and is transmitted to the airtight casing 10 through the securing members 103, the deformation of the spacers 14 and the shearing stress occurring at the portions (the spacer-supporting films 40) that are in contact with the spacers 14 can be reduced. In the display panel 210 according to the embodiment, such an impact is transmitted to the airtight casing 10 along a plurality of lines extending in the spacer longitudinal direction 110. For example, when an impact is transmitted to the airtight casing 10 through the securing members 103, the surfaces of the front and rear substrates 11 and 12 (the surfaces facing the vacuum) may deform into a rugged shape, or a sinusoidal wavy shape, in a cross section of the airtight casing 10 taken in the vertical direction indicated in FIGS. 1A to 1C and 3A and 3B. Meanwhile, in a cross section of the airtight casing 10 taken in the horizontal direction indicated in FIGS. 1A to 1C and 3A and 3B, the deformation of the airtight casing 10 (deformations of the front and rear substrates 11 and 12) are reduced much more than in the cross section of the airtight casing 10 taken in the vertical direction. That is, bow-shaped or sinusoidal wavy deformations of the plate-like spacers 14 observed in the cross section of the airtight casing 10 taken in the horizontal direction are suppressed. In contrast, in a case where the securing members are arranged orthogonally to the spacer longitudinal direction 110, when any impact is given, the surfaces of the front and rear substrates 11 and 12 may deform into a rugged shape, or a sinusoidal wavy shape, in a cross section of the airtight casing 10 taken in the horizontal direction. At the same time, the spacers 14 also receive a force causing a deformation into a rugged shape, or a sinusoidal wavy shape, in a cross section of the airtight casing 10 taken in the horizontal direction. This is because, in a cross section of such a display panel taken in the horizontal direction, the securing members are interspersed (provided periodically). Therefore, when an impact is given to the support 108 and is transmitted to the airtight casing 10 through the securing members (and the bonding members), the impact is transmitted to the portions of the airtight casing 10 where the securing members are bonded, but is not transmitted to the other portions of the airtight casing 10 where the securing members are not bonded. Accordingly, stress concentration occurs periodically at portions of the front substrate 11 and the rear substrate 12 where the spacers 14 are provided. In the portions where the stress is concentrated, there often occur damage to the spacers 14 due to a force acting to bend the spacers 14 and damage at the portions (spacer-supporting portions) where the spacers 14 are in contact due to the occurrence of shearing stress, as described below.

In the display panel 210 described in the embodiment, since the linear securing members 103 are arranged in such a manner as to extend in the spacer longitudinal direction 110, the above-described stress concentration is suppressed. Therefore, the occurrence of the above-mentioned situations that the image display apparatus may not work appropriately and that the image display quality may be deteriorated significantly are prevented.

Furthermore, the bonding members 122 are provided linearly, and the longitudinal directions of the bonding members 122 and the linear securing members 103 are made to correspond to the spacer longitudinal direction 110. Since the bonding members 122 extend along the cross section of the display panel 210 taken in the spacer longitudinal direction 110, stress concentration is further reduced. From the viewpoint of stress reduction, the bonding members 122 and the securing members 103 are to be positioned behind the spacers 14 across the rear substrate 12.

Furthermore, the bonding members 122 have the hollows (holes) 211 extending between the airtight casing 10 and the projections 207 (see FIG. 3B). The area of each hollow 211 is to be larger than the area of the outer shape of a single projection 207. If the projection 207 is a round column having a radius r, the area of the outer shape of the projection 207 is expressed as $\pi r^2$. That is, the area of the outer shape of the projection 207 is translated into the area of an orthographic projection of the projection 207 to the plate member (more specifically, the large-width portion 206) of the securing member 103.

In the embodiment shown in FIGS. 1A and 3A, the securing members 103A and 103B each include the large-width portions 206 and the small-width portions 208 that are connected alternately and continuously. The term "width" used herein regarding the large-width portions 206 and the small-width portions 208 denotes the dimension in the second direction Y (the direction orthogonal to the spacer longitudinal direction 110). The projections 207 are provided on the large-width portions 206 because of the following reason. If any impact of dropping or the like is transmitted to the airtight casing 10 through the projections 207, the stress of the impact is diffused over the large-width portions 206, whereby the impact transmitted to the airtight casing 10 is reduced. The area, shape, and thickness of the large-width portions 206, i.e., portions having a large area, are determined appropriately in accordance with the rigidity of the airtight casing 10, the expected magnitude of drop impact, and so forth.

The pitch and number of projections 207 are also determined appropriately in accordance with the rigidity of the airtight casing 10, the expected magnitude of drop impact, and so forth. The pitch (interval) of the projections 207 in the second direction Y (the direction orthogonal to the spacer longitudinal direction 110) is set to be larger than the pitch (interval) of the projections 207 in the first direction X (the spacer longitudinal direction 110). Practically, the pitch of the projections 207 in the first direction X is set to be smaller than half the pitch of the projections 207 in the second direction Y. The pitch of the projections 207 in the second direction Y can be considered as the pitch of (distance between) two adjacent ones of the different securing members 103 bonded to the rear substrate 12. With such settings, even if any impact is transmitted to the airtight casing 10 through the projections 207, the stress is reduced in the spacer longitudinal direction 110, whereby the deformation of the airtight casing 10 is suppressed. Accordingly, the occurrence of damage to the airtight casing 10 is suppressed. In contrast, if the pitch (interval) of the projections 207 in the second direction Y is set to be smaller than the pitch (interval) of the projections 207 in the first direction X, the stress cannot be diffused in the spacer longitudinal direction 110. Such a configuration is equivalent to the configuration in which the linear securing members are arranged such that the longitudinal direction thereof corresponds to the direction orthogonal to the spacer longitudinal direction 110.

According to the embodiment, the airtight casing 10 is provided with improved reliability, and the deformation of the spacers 14 provided in the airtight casing 10 and the shearing stress occurring at the portions (the spacer-supporting films 40) where the spacers 14 are provided are reduced. Moreover, the resistance variation occurring in each spacer 14 is reduced. Therefore, the occurrence of electric discharge or the like is suppressed, and the change in the trajectories of electrons emitted from the electron-emitting devices 18 is suppressed. Thus, a display panel and an image display apparatus that are highly reliable and display high-quality, stable images are provided.

The present invention can provide a display panel and an image display apparatus that are highly reliable and in which the difference between the temperature variations occurring on the front and on the rear of the display panel is reduced and a good image can be thus displayed over a long period of time.

Specific examples of the present invention, including variations thereof, will now be described.

EXAMPLES

Example 1

An image display apparatus of Example 1 will now be described with reference to FIGS. 1A to 1C and 3A and 3B. The thermally conductive structures 205A to 205E were provided on the rear of the airtight casing 10 in such a manner as to extend in the horizontal direction. The securing members 103 were integrally provided with the thin plate 222 made of aluminum and having a thickness of 1 mm and were bonded to the rear of the airtight casing 10 with the bonding members 122. A drive circuit board (not shown) was mounted on the thin plate 222.

In Example 1, the front panel 102 was bonded to the surface (the surface on the side of the atmosphere) of the front substrate 11 of the airtight casing 10 with the bonding member 121 (see FIG. 3B). The securing members 103 were bonded to the surface (the surface on the side of the atmosphere) of the rear substrate 12 of the airtight casing 10 with the bonding members 122. The airtight casing 10 had a configuration basically the same as that described with reference to FIGS. 5A to 5C. The diagonal dimension of the image display area was 55 inches. Surface-conduction electron-emitting devices were employed as the electron-emitting devices 18. The electron-emitting devices 18 were in contact with scanning wires and signal wires formed by firing an electrically conductive paste containing silver particles. The front substrate 11 and the rear substrate 12 each had a thickness of 2 mm. The gap between the front substrate 11 and the rear substrate 12 was 2 mm.

The flat, rectangular airtight casing 10 was sealed in vacuum such that the pressure thereinside was maintained to be $1.0\times10^{-5}$ Pa. The sidewall 13 was made of glass. The bonding members 23 were composed of indium. The front substrate 11 and the rear substrate 12 were joined to each other in a vacuum chamber by pressing the rear substrate 12 against the front substrate 11 while locally heating the joining member. The long, narrow, plate-like spacers 14 were provided such that the longitudinal direction 110 thereof corresponded to the longitudinal direction of the flat, rectangular airtight casing 10 (the first direction X, or the horizontal direction). The long, narrow, plate-like spacers 14 were arranged at 15-mm intervals in the direction orthogonal to the longitudinal direction of the airtight casing 10 (the second direction Y, or the vertical direction). The spacers 14 were made of glass and had a thickness of 200 μm. The spacers 14 were provided on some of the scanning wires, with the ends thereof in the longitudinal direction 110 being bonded to the rear substrate 12 with an inorganic adhesive (Aron Ceramic D of Toagosei). The longitudinal direction of the front panel 102, the longitudinal direction of the airtight casing 10, and the spacer longitudinal direction 110 were made to correspond to each other. The spacers 14 were made of cermet, with a sheet resistance of $5\times10^{12}$ Ω/square. The front panel 102 was made of glass, as were the front substrate 11 and the rear substrate 12, and had a larger area than the image display area of the airtight casing 10. While the front panel 102 in Example 1 had a thickness of 2.5 mm and had the same size as the front substrate 11, the thickness of the front panel 102, if made of glass, may be 1.5 to 3.5 mm, practically. Acrylic UV-curable resin adhesive was employed as the bonding member 121. The acrylic UV-curable resin adhesive was applied over the entirety of the surface of the front panel 102 near the front substrate 11 with a thickness of 0.5 mm. Practically, the thickness of the bonding member 121 may be 0.1 to 1 mm. The acrylic UV-curable resin adhesive had a Young's modulus of 1 to 10 MPa and a breaking elongation of 100% or higher. A benefit of such a combination of the front panel 102 and the bonding member 121 is that reflection and glaring in the image display area due to external light are prevented.

The securing members 103 each included the plate member (including the portions 206 and 208) made of aluminum and having a thickness of about 2 mm, and bosses (projections 207) provided on the large-width portions 206 of the plate member. One-component silicone adhesive was employed as the bonding members 122 with which the rear of the airtight casing 10 and the securing members 103 were bonded together. The securing members 103 and the thin plate 222 were assembled together in advance by welding.

The thermally conductive structures 205A to 205E were five graphite sheets. A thermally insulating member was provided in each of the gaps (air gaps) between the graphite sheets adjacent to one another in the vertical direction. That is, four thermally insulating members were provided in total. The gaps (air gaps) extended in the spacer longitudinal direction 110. The gap, denoted by d, between each two adjacent ones of the graphite sheets was about 40 mm. The graphite sheets each included a graphite film having a thickness of about 0.5 mm sealed between a polyethylene terephthalate film having a thickness of about 0.05 mm and an aluminum foil having a thickness of about 0.05 mm. The graphite sheets each had an in-plane thermal conductivity (thermal conductivity in the horizontal and vertical directions) of about 400 to 500 W/mK and a thermal conductivity in the depth direction of about 3 to 15 W/mK.

As a result, when the display panel 210 was oriented so as to display an image (in a state where the display surface extended in the vertical direction (parallel to the direction of gravitational force) and the spacer longitudinal direction 110 corresponded to the horizontal direction), the thermal conductivity of the thermally conductive member 300 became smaller in the order of that in the horizontal direction, that in the vertical direction, and that in the depth direction. With the four thermally insulating members, the thermally conductive member 300 had a thermal conductivity of 400 W/mK in the horizontal direction, and a thermal conductivity of about 300 W/mK in the vertical direction.

Thus, compared to the known configuration in which no thermally insulating members are provided and one graphite sheet is provided in contact with the entirety of the rear of the airtight casing 10, the difference between the range of temperature variation in the front substrate 11 and the range of temperature variation in the rear substrate 12 in the vertical direction was reduced to about 0.6 times that of the known configuration.

Figure 2A:
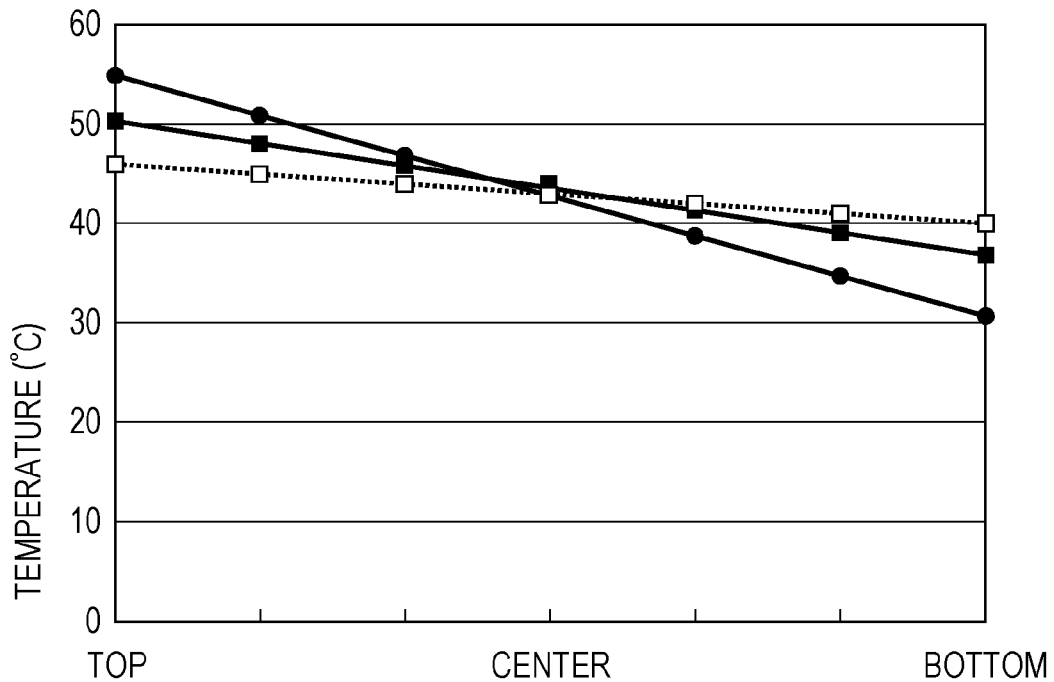
FIGS. 2A and 2B are graphs showing temperature variations.
Figure 2B:
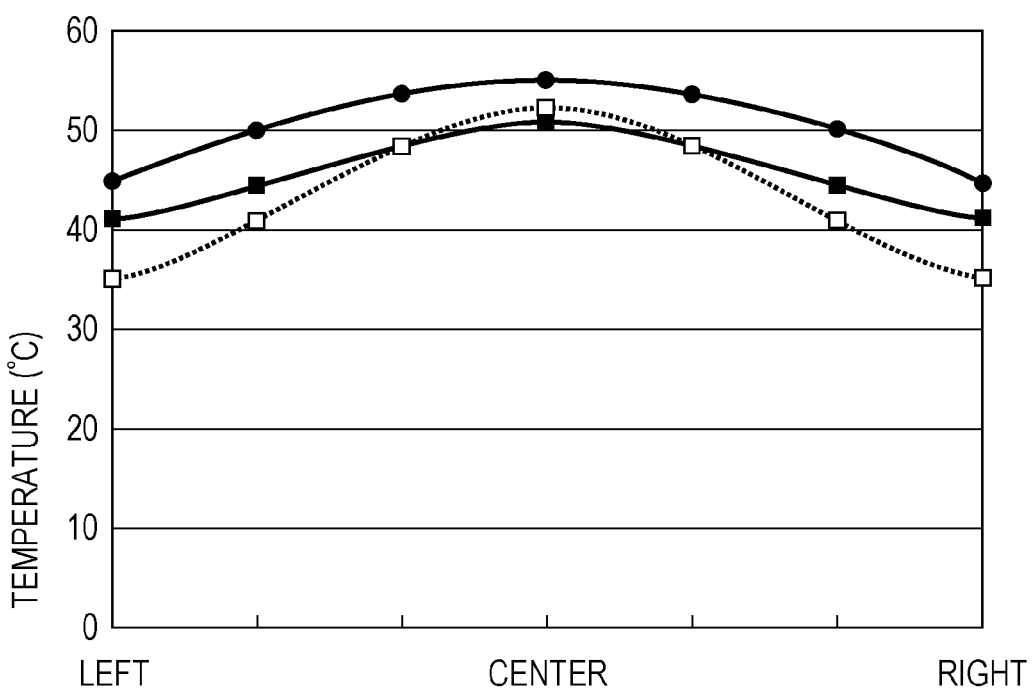

Referring now to FIGS. 2A and 2B, the temperature variation occurring in the display panel 210 will be described.

FIG. 2A shows the temperature variation occurring in a vertical cross section of the display panel 210 (taken along the line A-A in FIG. 1A), the cross section passing substantially the center of the display panel 210. The vertical axis represents the temperature, and the horizontal axis represents the position on the display panel 210 in the vertical direction. The solid circles represent temperatures of the front substrate 11 in Example 1. The solid squares represent temperatures of the rear substrate 12 in Example 1. The empty squares represent temperatures of the rear substrate 12 in a known configuration in which a thermally conductive member having thermal conductivity that is uniform in the vertical direction is provided on the rear substrate 12, as disclosed in Japanese Patents Laid-Open No. 2002-156913 and No. 2004-333904. In Example 1, the thermally conductive member 300 had thermal conductivity that is anisotropic in the vertical (gravitational), horizontal, and depth directions. Thus, the temperature variation occurring in the rear substrate 12 in the vertical direction became approximate to the temperature variation occurring in the front substrate 11 in the vertical direction. As a result, the difference between the temperature variation in the front substrate 11 and the temperature variation in the rear substrate 12 was reduced.

FIG. 2B shows the temperature variation in a horizontal cross section of the display panel 210 (taken along the line B-B in FIG. 3A), the cross section passing substantially the center of the display panel 210. The vertical axis represents the temperature, and the horizontal axis represents the position on the display panel 210 in the horizontal, i.e., lateral, direction. The solid circles represent temperatures of the front substrate 11 in Example 1. The solid squares represent temperatures of the rear substrate 12 in Example 1. The empty squares represent temperatures of the rear substrate 12 of a known configuration in which a thermally conductive member having thermal conductivity that is non-uniform in the horizontal direction is provided on the rear substrate 12, as disclosed in Japanese Patent Laid-Open No. 2004-333904.

In Example 1, the thermally conductive member 300 had thermal conductivity that was anisotropic in the vertical (gravitational), horizontal, and depth directions. Thus, the temperature variation occurring in the rear substrate 12 in the horizontal direction became approximate to the temperature variation occurring in the front substrate 11 in the horizontal direction. As a result, the difference between the temperature variation in the front substrate 11 and the temperature variation in the rear substrate 12 was reduced.

Furthermore, the support 108 and the front panel 102 were attached to the display panel 210 of Example 1, as shown in FIG. 3B, whereby an image display apparatus was obtained. Then, an image was displayed on the image display apparatus over a long period of time. As a result, a good image was displayed over a long period of time with no damage and the like in the airtight casing 10 and no image irregularities near the spacers 14. In addition, a drop impact test and a vibration test were conducted for the image display apparatus of Example 1. In the tests, the apparatus was dropped from a height of 20 cm. The tests were conducted such that direct impact and vibration were applied to the support 108 (the impact and vibration were transmitted to the airtight casing 10 through the support 108 (the securing members 103)). As a result, no cracking was found in the airtight casing 10. Moreover, when an image was displayed on the image display apparatus that had undergone the drop impact test, no electric discharge occurred, and the image was displayed stably over a long period of time. Furthermore, when the airtight casing 10 was disassembled, no damage was found in the spacers 14, and no traces of breakages of the metal back layer 20 and the spacer-supporting films 40 due to the spacers 14 were found.

According to Example 1, the airtight casing 10 and the image display apparatus were provided with high reliability and with reduced weights. Moreover, the difference between the temperature variation in the front substrate 11 and the temperature variation in the rear substrate 12 was reduced, whereby an image display apparatus capable of displaying a good image was obtained. In addition, by employing graphite sheets as the thermally conductive structures and providing thermally insulating members arranged side by side in the vertical direction and each extending in the horizontal direction, the thermally conductive member 300 having anisotropic thermal conductivity was easily manufactured.

Example 2

An image display apparatus of Example 2 will now be described with reference to FIGS. 4A to 4D.

In Example 1, when the display panel 210 was oriented so as to display an image, the image display area was set to be in landscape orientation. In Example 2, when the display panel 210 was oriented so as to display an image, the image display area was set to be in portrait orientation. That is, unlike Example 1, Example 2 concerns an image display apparatus that displays an image in portrait orientation. Such an image display apparatus can be used for large-area digital signage and the like. The airtight casing 10 had the same configuration as that of Example 1.

FIG. 4A schematically shows the display panel 210 seen from the rear, as does in FIG. 1A. When the display panel 210 was oriented so as to display an image, the spacers 14 and the airtight casing 10 were oriented such that the longitudinal directions thereof corresponded to the vertical direction. FIG. 4B is a cross-sectional view taken along the line IVB-IVB in FIG. 4A (a cross-sectional view taken in the vertical direction).

In Example 2, the thermally conductive member 300 having anisotropic thermal conductivity included three thermally conductive structures 305A, 305B, and 305C. The thermally conductive structures 305A and 305B each included a plurality of thermally conductive sheets 305A or 305B. The thermally conductive sheets 305A and 305B were alternately and continuously provided side by side on the rear of the airtight casing 10. The thermally conductive structure 305C was provided over the thermally conductive structures 305A and 305B such that the thermally conductive structures 305A and 305B are held between the thermally conductive structure 305C and the rear substrate 12.

In Example 2, unlike Example 1, a highly rigid frame 209 made of an aluminum plate having a thickness of 20 mm was provided. The frame 209 had bosses (projections) 207 welded thereto. The bosses 207 were provided for screwing the display panel 210 to the support 108. The frame 209 was bonded to the rear substrate 12 with the bonding members 122. Since the highly rigid frame 209 was provided, the front panel 102 provided in Example 1 was not provided in Example 2.

FIG. 4D shows the display panel 210 shown in FIG. 4A with the frame 209 and the bonding members 122 removed therefrom. FIG. 4C shows the display panel 210 shown in FIG. 4D with the thermally conductive structure 305C removed therefrom.

The thermally conductive member 300 had a two-layer structure. The thermally conductive structures 305A and 305B were thermally conductive sheets having isotropic conductivity. First thermally conductive sheets included in the thermally conductive structure 305A had a thermal conductivity of about 50 W/mK. Second thermally conductive sheets included in the thermally conductive structure 305B had a thermal conductivity of about 0.5 W/mK. The first and second thermally conductive sheets having such isotropic thermal conductivities may be made of, for example, silicon rubber. Various kinds of such thermally conductive sheets having isotropic thermal conductivity are commercially available and can be selected in accordance with the desired thermal conductivity.

Nine strip-like first thermally conductive sheets 305A were provided at specific intervals and in contact with the surface of the rear substrate 12 remote from the front substrate 11 such that the longitudinal direction thereof corresponded to the horizontal direction. Furthermore, between the nine first thermally conductive sheets 305A, eight strip-like second thermally conductive sheets 305B were provided in contact with the surface of the rear substrate 12 remote from the front substrate 11. Thus, almost the entirety of the rear surface of the rear substrate 12 was covered with the first and second thermally conductive sheets 305A and 305B. The first and second thermally conductive sheets 305A and 305B had a width (the dimension in the vertical direction) of about 30 mm and a thickness (the dimension in the depth direction) of 0.25 mm.

A third thermally conductive sheet, i.e., the thermally conductive structure 305C, was made of a material the same as that of the second thermally conductive sheets 305B. By covering the first and second thermally conductive sheets 305A and 305B with the third thermally conductive sheet 305C, the third thermally conductive sheet 305C and the set of the first and second thermally conductive sheets 305A and 305B were connected to each other in the thickness direction of the thermally conductive member 300.

By providing each of the second thermally conductive sheets 305B between two adjacent ones of the first thermally conductive sheets 305A, the thermal conductivity of the thermally conductive member 300 in the vertical direction (about 43 W/mK) was made to be lower than the thermal conductivity of the thermally conductive member 300 in the horizontal direction (about 50 W/mK). Thus, the difference between the range of temperature variation in the front substrate 11 and the range of temperature variation in the rear substrate 12 in the vertical direction was reduced, as was in Example 1, to about 0.8 times that of the known configuration.

The thermal conductivity of the thermally conductive member 300 in the depth direction was able to be set to about 20 W/mK because the thermally conductive member 300 included the two layers in the depth direction.

According to Example 2, the thermal conductivity of the thermally conductive member 300 was set to become smaller in the order of that in the horizontal direction, that in the vertical (gravitational) direction, and that in the depth direction, whereby the difference in temperature variation between the front and rear of the display panel 210 was reduced. When an image was displayed on the display panel 210 of Example 2 over a long period of time, as was in Example 1, no damage or the like was found in the airtight casing 10. Although the image quality was slightly reduced compared to that in Example 1, no significant image irregularities were observed near the spacers 14. In Example 2, however, since the highly rigid frame 209 was provided, the weight of the image display apparatus was greater than that of Example 1. Instead, since a combination of a plurality of isotropic thermally conductive sheets that are commercially available at low prices was employed, the thermally conductive member 300 having anisotropic thermal conductivity was manufactured at a low cost and with ease.

According to the present invention described above, the difference in temperature variation between the front and rear of the display panel can be reduced. Therefore, a display panel and an image display apparatus that are highly reliable and are capable of displaying good images over a long period of time are provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-283453 filed Dec. 14, 2009, which is hereby incorporated by reference herein in its entirety.

What is claimed is:

1. A display panel comprising:
   an airtight casing including:
      a front substrate,
      a rear substrate facing the front substrate with a gap therebetween, and
      a plurality of plate-like spacers provided side by side between the front substrate and the rear substrate in such a manner as to be parallel to each other in a longitudinal direction thereof; and
   a thermally conductive member connected to a surface of the rear substrate remote from the front substrate,
   wherein a thermal conductivity of the thermally conductive member in the longitudinal direction of the spacers is higher than a thermal conductivity of the thermally conductive member in a direction in which the spacers are provided side by side, and the thermal conductivity of the thermally conductive member in the direction in which the spacers are provided side by side is higher than a thermal conductivity of the thermally conductive member in a thickness direction.

2. The display panel according to claim 1,
   wherein the thermally conductive member includes a plurality of thermally conductive sheets, and
   wherein the thermally conductive sheets are spaced apart from each other in the direction in which the spacers are provided side by side, and the thermally conductive sheets are provided on the surface of the rear substrate remote from the front substrate such that a longitudinal direction of the thermally conductive sheets corresponds to the longitudinal direction of the spacers.

3. The display panel according to claim 2, wherein the thermally conductive sheets are graphite sheets.

4. The display panel according to claim 1, further comprising:
   a front panel bonded to a surface of the front substrate remote from the rear substrate; and
   a linear securing member bonded to the surface of the rear substrate and between two adjacent ones of the thermally conductive sheets, the linear securing member extending in the longitudinal direction of the spacers.

5. The display panel according to claim 4,
   wherein the linear securing member includes
      a plate member bonded to the rear substrate with a bonding member, and
      a plurality of projections provided on a surface of the plate member remote from the rear substrate.

6. The display panel according to claim 5,
   wherein the plate member includes large-width portions and small-width portions alternately provided in the longitudinal direction of the spacers, and
   wherein the projections are provided on the large-width portions.

7. The display panel according to claim 5,
   wherein the bonding member has a hole extending between the plate member and the rear substrate.

8. The display panel according to claim 1, wherein the spacers have a sheet resistance of approximately $1 \times 10^{11}$ Ω/square at the minimum and approximately $1 \times 10^{14}$ Ω/square at the maximum.

9. An image display apparatus comprising:
   the display panel according to claim 1; and
   a support configured to fix the display panel on an installation surface with a securing member interposed between the support and the display panel.

10. The image display apparatus according to claim 9,
    wherein the thermally conductive member includes a plurality of thermally conductive sheets, and
    wherein the thermally conductive sheets are spaced apart from each other in the direction in which the spacers are provided side by side, and the thermally conductive sheets are provided on the surface of the rear substrate remote from the front substrate such that a longitudinal direction of the thermally conductive sheets corresponds to the longitudinal direction of the spacers.

11. The image display apparatus according to claim 10, wherein the thermally conductive sheets are graphite sheets.

12. The image display apparatus according to claim 9, wherein the display panel further comprises:
    a front panel bonded to a surface of the front substrate remote from the rear substrate, and
    a linear securing member bonded to the surface of the rear substrate and between two adjacent ones of the thermally conductive sheets, the linear securing member extending in the longitudinal direction of the spacers.

13. The image display apparatus according to claim 12,
    wherein the linear securing member includes:
       a plate member bonded to the rear substrate with a bonding member, and
       a plurality of projections provided on a surface of the plate member remote from the rear substrate.

14. The image display apparatus according to claim 9, wherein the spacers have a sheet resistance of approximately $1\times10^{11}$ Ω/square at the minimum and approximately $1\times10^{14}$ Ω/square at the maximum.

15. A display panel comprising:
   an airtight casing including a front substrate and a rear substrate facing the front substrate with a gap therebetween;
   a conductive member connected to a surface of the rear substrate remote from the front substrate; and
   a securing member connected to the rear substrate,
   wherein the securing member is connected to a support capable of supporting the display panel, the securing member being connected such that a surface of the front substrate near the rear substrate extends in a gravitational direction defined in a state where the display panel is oriented so as to display an image, and
   wherein a thermal conductivity of the thermally conductive member in the gravitational direction is lower than a thermal conductivity of the thermally conductive member in a horizontal direction orthogonal to the gravitational direction, and the thermal conductivity of the thermally conductive member in the gravitational direction is higher than a thermal conductivity of the thermally conductive member in a thickness direction.

* * * * *